(12) United States Patent
Chen (10) Patent No.: US 8,269,280 B2
(45) Date of Patent: *Sep. 18, 2012

(54) I/O AND POWER ESD PROTECTION CIRCUITS BY ENHANCING SUBSTRATE-BIAS IN DEEP-SUBMICRON CMOS PROCESS

(75) Inventor: Jau-Wen Chen, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/110,581

(22) Filed: May 18, 2011

(65) Prior Publication Data

US 2011/0215410 A1 Sep. 8, 2011

Related U.S. Application Data

(60) Continuation of application No. 12/506,746, filed on Jul. 21, 2009, now Pat. No. 7,948,036, which is a division of application No. 11/258,253, filed on Oct. 25, 2005, now Pat. No. 7,582,938, which is a continuation-in-part of application No. 10/676,602, filed on Oct. 1, 2003, now Pat. No. 6,979,869.

(51) Int. Cl.
*H01L 23/62* (2006.01)
(52) U.S. Cl. .............. 257/357; 257/360; 257/E27.016
(58) Field of Classification Search .............. 257/357, 257/360, E27.016
See application file for complete search history.

(56) References Cited

U.S. PATENT DOCUMENTS

| | | | |
|---|---|---|---|
| 4,855,620 A | 8/1989 | Duvvury et al. | |
| 5,401,996 A | 3/1995 | Kelly | |
| 5,623,156 A | 4/1997 | Watt | |
| 5,932,914 A | 8/1999 | Horiguchi | |
| 6,329,694 B1 * | 12/2001 | Lee et al. | 257/372 |
| 6,469,354 B1 | 10/2002 | Hirata | |
| RE38,222 E | 8/2003 | Wu | |
| 6,750,517 B1 | 6/2004 | Ker et al. | |
| 6,788,507 B2 * | 9/2004 | Chen et al. | 361/56 |
| 6,858,902 B1 | 2/2005 | Sailing et al. | |

OTHER PUBLICATIONS

"ESD in Silicon Integrated Circuit," Design Concepts, Chapter 4, Section 2, p. 69-71.
Duvvury, C., "ESD on-chip protection in advanced technologies," 1999 ESD Tutorial, Orlando, FL, Sep. 26, 1999.
Duvvury, C. et al., "Advanced CMOS Protection Devices Trigger Mechanisms During CDM," EOS/ESD Symposium, 1995.

* cited by examiner

*Primary Examiner* — Kimberly Rizkallah
*Assistant Examiner* — Timor Karimy
(74) *Attorney, Agent, or Firm* — Otterstedt, Ellenbogen & Kammer, LLP (57) ABSTRACT

A technique for enhancing substrate bias of grounded-gate NMOS fingers (ggNMOSFET's) has been developed. By using this technique, lower triggering voltage of NMOS fingers can be achieved without degrading ESD protection in negative zapping. By introducing a simple gate-coupled effect and a PMOSFET triggering source with this technique, low-voltage triggered NMOS fingers have also been developed in power and I/O ESD protection, respectively. A semiconductor device which includes a P-well which is underneath NMOS fingers. The device includes an N-well ring which is configured so that the inner P-well underneath the NMOS fingers is separated from an outer P-well. The inner P-well and outer P-well are connected by a P-substrate resistance which is much higher than the resistance of the P-wells. A P+-diffusion ring surrounding the N-well ring is configured to connect to VSS, i.e., P-taps.

20 Claims, 9 Drawing Sheets

I/O AND POWER ESD PROTECTION CIRCUITS BY ENHANCING SUBSTRATE-BIAS IN DEEP-SUBMICRON CMOS PROCESS

CROSS-REFERENCE TO RELATED APPLICATION(S)

This application is a continuation of U.S. patent application Ser. No. 12/506,746, filed on Jul. 19, 2009, which is hereby incorporated herein by reference in its entirety. U.S. patent application Ser. No. 12/506,746 is a divisional of U.S. patent application Ser. No. 11/258,253 (now U.S. Pat. No. 7,582,938), filed on Oct. 25, 2005, which is hereby incorporated herein by reference in its entirety. U.S. patent application Ser. No. 11/258,253 is a continuation-in-part of U.S. patent application Ser. No. 10/676,602 (now U.S. Pat. No. 6,979,869), filed on Oct. 1, 2003, which is hereby incorporated herein by reference in its entirety.

FIELD OF THE INVENTION

The present invention generally relates to ESD (Electro-Static Discharge) protection devices in integrated-circuit chip designs, and more specifically relates to low-voltage trigger NMOS fingers.

BACKGROUND OF THE INVENTION

Figure 1:
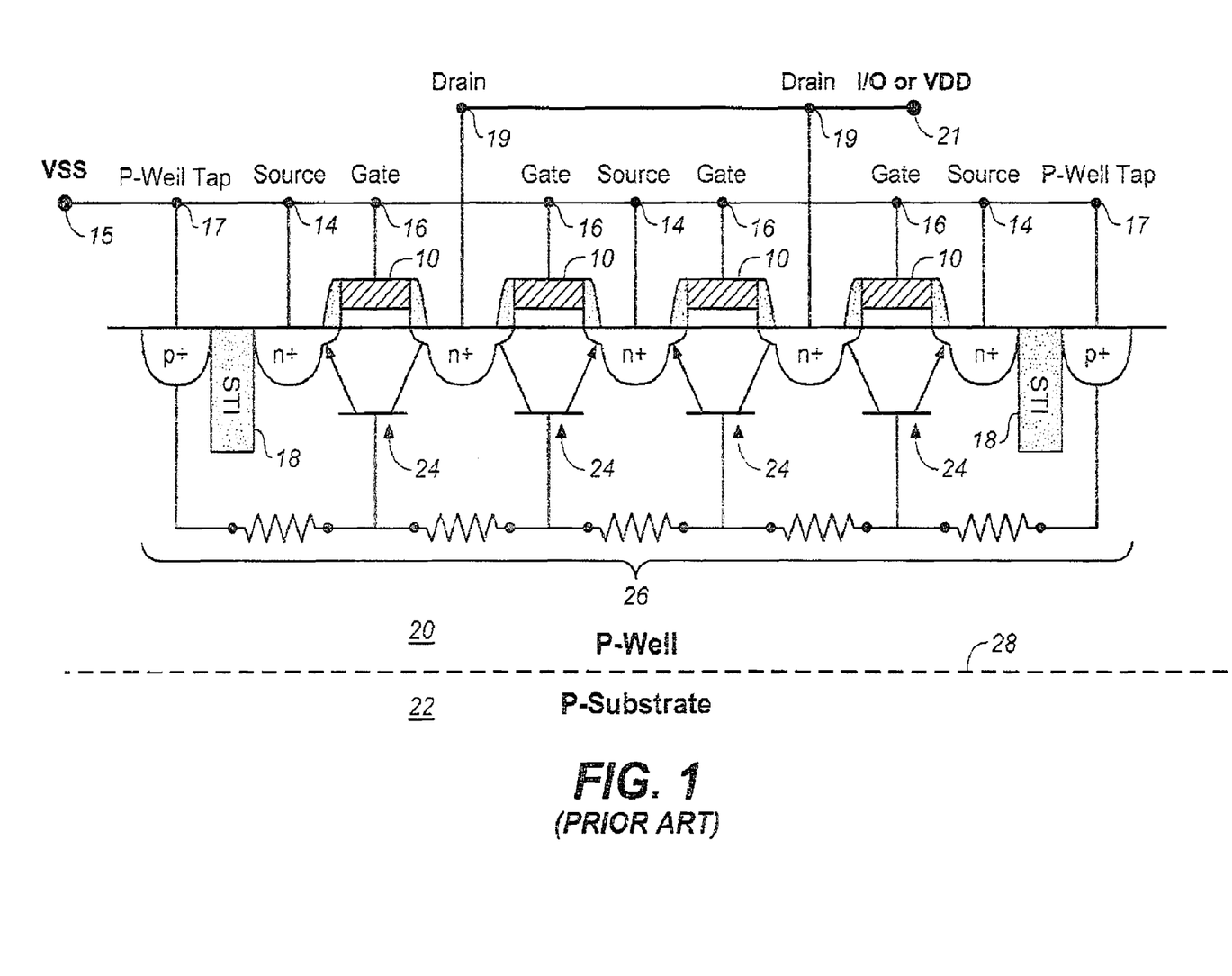
FIG. 1 provides a cross-sectional diagram of a typical four-finger ggNMOSFET.

Grounded-gate NMOSFET's (ggNMOSFET's) are widely used as the power pin ESD (Electro-Static Discharge) protection device in integrated-circuit chip designs. A cross-sectional diagram of a typical four-finger ggNMOSFET is shown in FIG. 1, wherein reference numerals 10 identify the fingers. The ggNMOSFET is triggered by turning-on parasitic bipolar transistors 24 due to avalanche breakdown with the generation of electron-hole pairs. In FIG. 1, reference numerals 14 identify source connections to VSS 15, reference numerals 16 identify gate connections to VSS 15, reference numerals 17 identify P-well tap connections to VSS 15, reference numerals 19 identify drain connections to I/O or VDD 21, and reference numerals 18 identify shallow trench isolation ("STI") regions.

The P-well 20 is formed on a P-conductivity type substrate 22. To trigger the parasitic bipolar transistors 24, the effective P-Well resistance 26 plays an important role because of building-up the potential at the source to P-Well junction 28. However, the doping concentration of the P-well 20 is usually much higher than that of the resistance of the P-substrate 22, so the effective P-Well resistance 26 is relatively low. Therefore, the traditional ggNMOSFET has a higher trigger voltage. As CMOS technology scales down in the semiconductor industry, gate-oxide thickness decreases (e.g., 20 Angstroms in 0.13 µm node technology), as well as junction depth. Therefore, the ESD protection window is narrowed because the triggering voltage of ggNMOSFET's is very close to the voltage level at which the oxide breaks down. It becomes especially difficult to protect ESD protection devices in power-crossing circuitry, e.g., in digital-to-analog or analog-to-digital interface circuits. To lower the triggering voltage of ggNMOSFET's, U.S. Pat. No. 6,469,354 proposes providing a high impedance region between ggNMOSFET's and VSS P-well taps to trigger the parasitic bipolar transistors below avalanche breakdown due to the high resistance of the P-substrate. This high impedance region can generate a higher substrate resistance so that the base-emitter potential at the P-well to source junction can be easily built up, and thus lower the triggering voltage of ggNMOSFET's. Unfortunately, this high impedance region also generates a higher resistance path from VSS P-well taps to drains of ggNMOSFET's, and thus creates a higher voltage drop in ESD negative zapping. Therefore, this approach is to improve ESD protection in positive zapping, but degrade ESD protection in negative zapping. This approach cannot be a universal solution in CMOS technology because, unless an additional P/N junction diode is provided, ESD protection degrades in the case of negative zapping, due to the high-impedance region. Additionally, triggering voltage cannot be lowered too substantially in the case of high avalanche breakdown junction design.

In C. Duvvury & A. Amerasekera, *Advanced CMOS Protection Device Trigger Mechanisms During CDM*, 1995 EDS/ESD Symposium (*EOS*-17), pp. 162-174, gate-coupled NMOS fingers were designed to lower the triggering voltage by using an external capacitor and an external resistor. However, this gate-coupled device usually needs a large layout area, and thus is not feasible.

The purpose of the present invention is to lower the triggering voltage of ggNMOSFET's by enhancing substrate bias without degrading ESD protection in negative zapping. With this substrate-biased technique, a gate-coupled effect and a triggering source are also introduced in power and I/O ESD protection, respectively.

OBJECTS AND SUMMARY OF THE INVENTION

An object of an embodiment of the present invention is to provide low-voltage trigger NMOS fingers by introducing both a gate-coupled effect and a high substrate resistance as the ESD power clamp device.

Another object of an embodiment of the present invention is to provide a gate-coupled effect by using only a simple N-Well resistor, and using a high substrate resistance to enhance the trigger when the gate is coupled.

Still another object of an embodiment of the present invention is to lower the triggering voltage without degrading ESD protection in negative zapping direction.

Still yet another object of an embodiment of the present invention is to provide an ESD protection device which is configured such that avalanche breakdown is not the main trigger mechanism.

Briefly, and in accordance with at least one of the foregoing objects, an embodiment of the present invention provides a semiconductor device which includes a P-well which is underneath NMOS fingers. The device includes an N-well ring which is configured so that the inner P-well underneath the NMOS fingers is separated from an outer P-well. The inner P-well and outer P-well are connected by a P-substrate resistance which is much higher than the resistance of the P-wells. A P+-diffusion ring surrounding the N-well ring is configured to connect to VSS, i.e., P-taps.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DETAILED DESCRIPTION OF PREFERRED EMBODIMENTS

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

Substrate-Biased Enhancement

Figure 2:
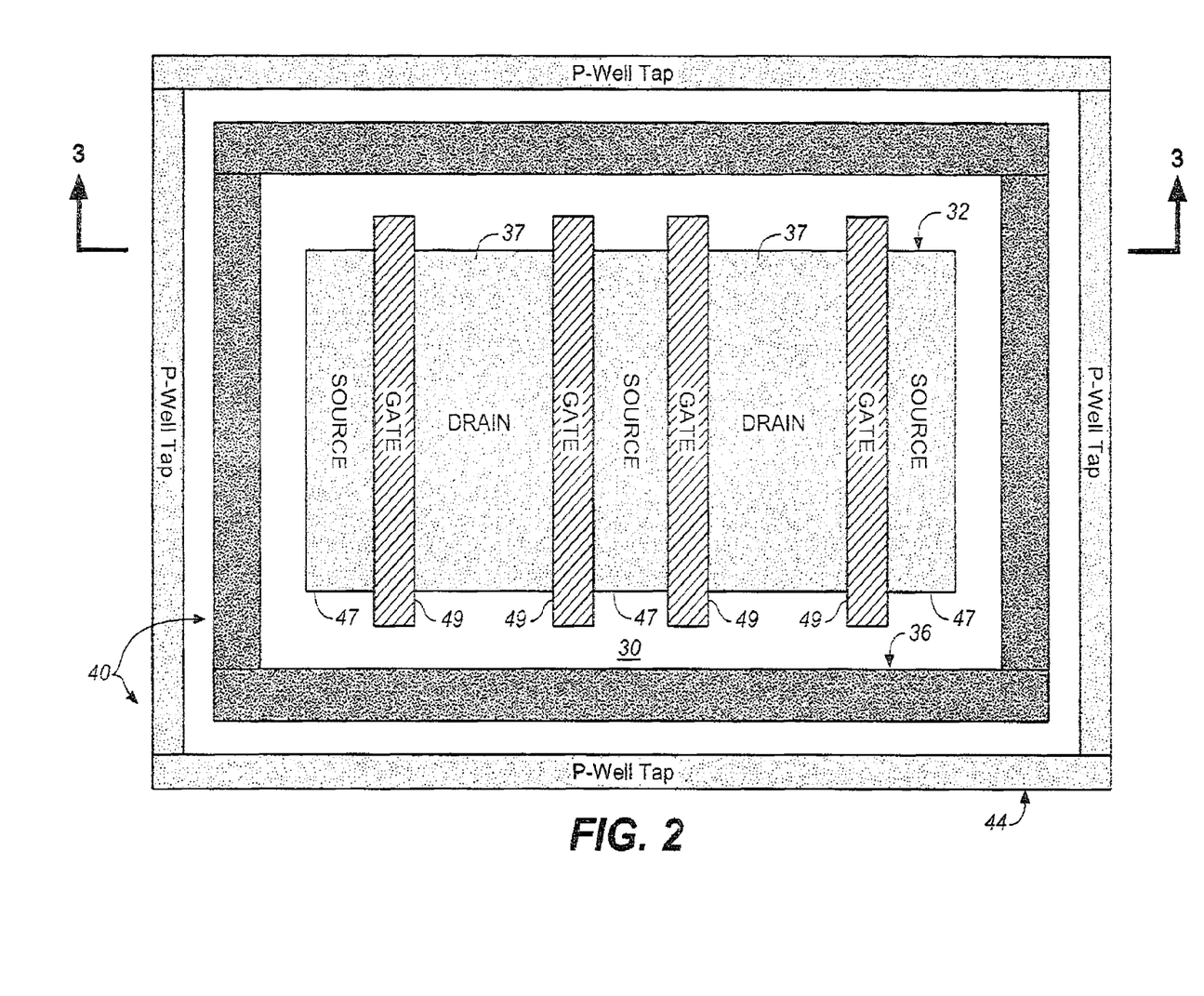
FIG. 2 provides a top view of an NMOSFET design layout for power ESD protection which is in accordance with an embodiment of the present invention.
Figure 3:
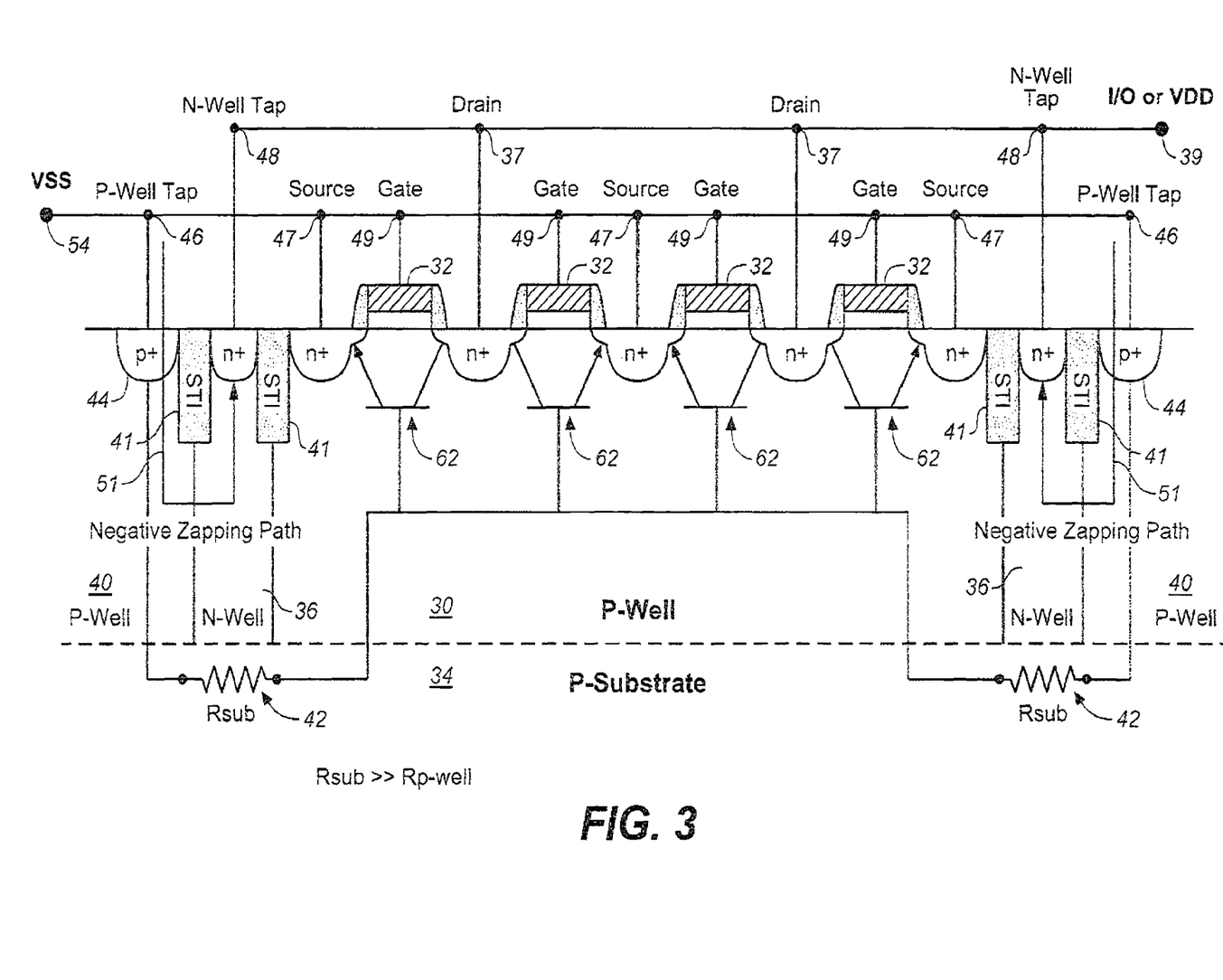
FIG. 3 provides a side, cross-sectional view of the design shown in FIG. 2, taken along line 3-3 of FIG. 2.

FIGS. 2 and 3 show top-view and a cross-sectional diagrams, respectively, for the substrate-biased approach in this invention. In FIGS. 2 and 3, unsilicided NMOS fingers 32 are used for the ESD protection device. A P-well 30 is underneath NMOS fingers 32 and is formed on a P-conductivity type substrate 34. The P-well 30 is surrounded by an N-well ring (VDD) 36. The N-well ring 36 is designed so that the inner P-well 30 underneath the NMOS fingers 32 is separated from the outer P-well 40. More specifically, the N-well ring 36 isolates the first P-well 30 (which is underneath NMOS fingers 32) and the second P-well 40 (which is electrically connected to VSS, i.e., shorted to VSS by using metal (P-taps)). The inner P-well 30 and outer P-well 40 are connected by a P-substrate resistance 42 which is much higher than the resistance of the P-wells 30, 40. A P+-diffusion ring 44 surrounding the N-well ring 36 is configured to connect to VSS, i.e., P-taps. In FIG. 3, reference numerals 46 identify P-well taps connected to VSS 54, reference numerals 47 identify source connects to VSS 54, reference numerals 49 identify gate connects to VSS 54, and reference numerals 48 identify N-well taps to I/O or VDD 39. The NMOS fingers 32 are surrounded by an N-well ring 36 so that the inner P-well 30 underneath the NMOS fingers 32 is separated from the outer P-well 40. The inner and outer P-wells are connected through P-substrate resistance 42 which is much higher than P-well resistance. A P+-diffusion ring 44 surrounding this N-well ring 36 is designed to connect to VSS, i.e., P-well taps 46. Because the inner P-well 30 is not hard wired to VSS but is shorted to VSS through the P-substrate 34, it can be treated as a "pseudo" floating P-well. In the present invention, both the N-well ring 36 and the drains 37 of the NMOS fingers 32 are always connected electrically to I/O pad or VDD pad 39, as shown in FIG. 3.

In the positive ESD zapping, I/O pad (or VDD pad) voltage is induced and thus a reverse junction current will flow from the I/O pad (or VDD pad) to VSS through the inner P-well 30, the P-substrate 34 and the outer P-well 40. As impact ionization takes place in the drain junction due to higher pad voltage, the current increases because electron-hole pairs are generated. Due to this hole current, the forward bias at the source junction (i.e., base-emitter junction of parasitic bipolar transistors) increases, and finally turns on the parasitic bipolar transistors. As the parasitic bipolar transistors are turned on, the pad voltage is called the triggering voltage.

Because the substrate resistance is much higher than the P-well resistance, the triggering voltage can be lower than the traditional NMOS fingers as shown in FIG. 1. Furthermore, as the pad voltage increases, the N-well ring 36 is reverse-biased so that the N-well to P-substrate junction is fully depleted. This fully depleted region will suppress the current into the deeper P-substrate and results in higher P-substrate resistance. This depleted region is deeper than the depletion due to built-in potential at this junction. Therefore, the triggering voltage of NMOS fingers is even lower than the approach proposed by U.S. Pat. No. 6,469,354.

In the negative ESD zapping, because the N-well 36 is deeper than STI (Shallow-Trench Isolation) 41 in CMOS process, the ESD current can flow from the P-well taps 46 to the I/O pad (or VDD pad) 39 through the outer P-well/N-well junction diode. In FIG. 3, the lines identified by reference numeral 51 indicate the current flow direction during negative zapping.

Therefore, unlike U.S. Pat. No. 6,469,354, this N-well ring 36 not only provides the substrate-biased enhancement for NMOS fingers in positive ESD stress, but also provides an ESD current path in negative ESD stress.

In Latch-Up overshoot and undershoot events, holes and electrons will be injected into P-well 30 and P-substrate 34, respectively. Both N-well 36 and P-well 44 guard rings surrounding the NMOS fingers in this invention have the ability to capture these electrons and holes. This avoids enabling the NMOS fingers 32 in Latch-Up events. Therefore, the NMOS fingers 32 in this invention are immune to Latch-Up overshoot and undershoot events.

In summary, there are at least three advantages of the present invention over the traditional NMOS fingers and the approach proposed by, for example, U.S. Pat. No. 6,469,354:

1. An N-well ring 36 connected to drains 37 of NMOS fingers 32 enhances substrate bias underneath NMOS fingers, and thus lowers the triggering voltage of the NMOS fingers. In 90 nm technology, it was found that the triggering voltage is at least 1V lower than that of the traditional NMOS fingers.
2. An N-well ring 36 connected to drains 37 of NMOS fingers provides a reverse junction diode for ESD current in negative stress. This junction diode avoids the ESD current flowing into the high-resistance P-substrate region 34.
3. Latch-Up immunity can be achieved by using this invention.

Figure 4:
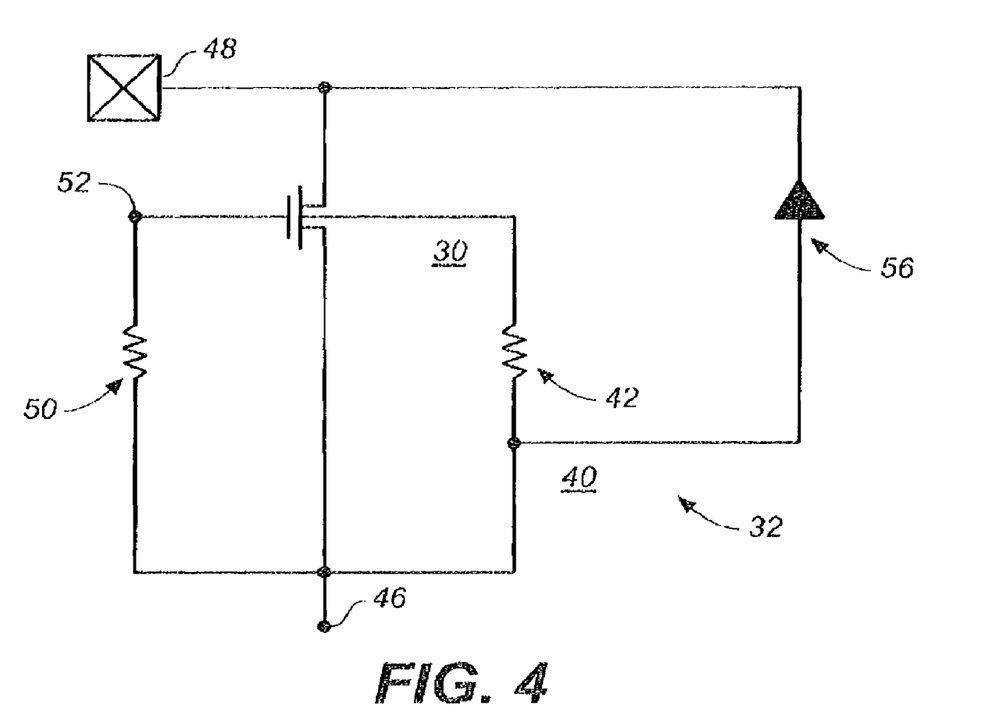
FIG. 4 provides an exemplary schematic circuit diagram of one of the NMOS fingers shown in FIGS. 2 and 3.

A schematic circuit diagram of one of the NMOS fingers 32 is shown in FIG. 4. As shown, a high-value N-well resistor 50 is disposed between the gates 52 and VSS 46. Reference numeral 30 in FIG. 4 identifies the inner P-well which is underneath the NMOS fingers 32, reference numeral 40 identifies the outer P-well, reference numeral 42 identifies the substrate resistance and reference numeral 56 identifies an N-well diode.

Figure 5:
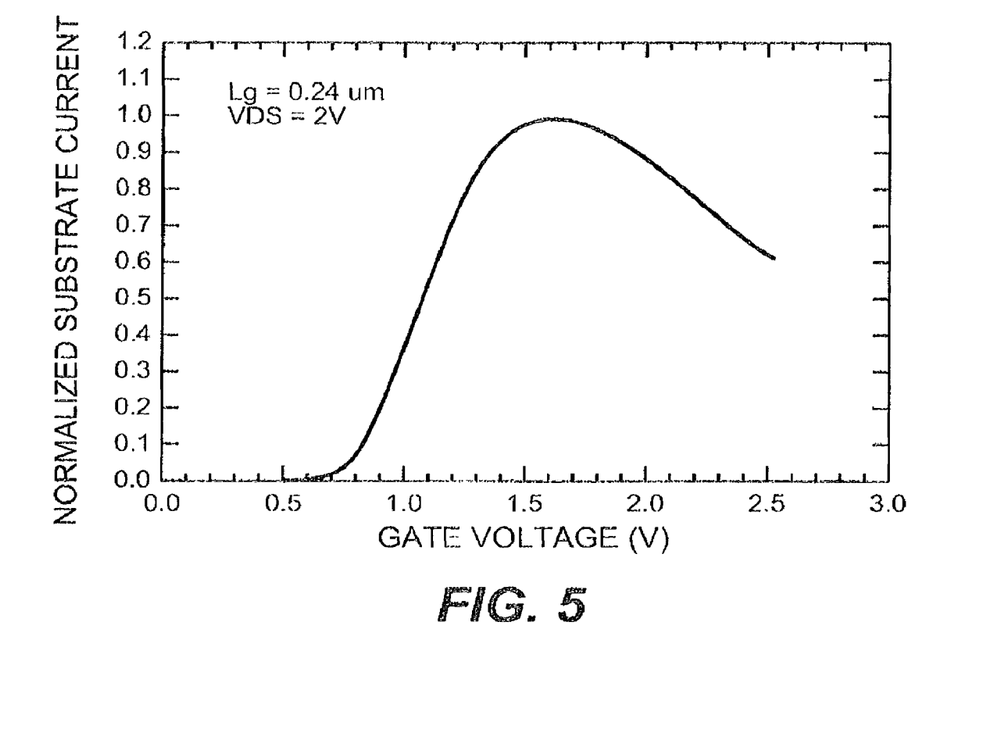
FIG. 5 is a graph which shows gate-voltage dependence of normalized substrate current in 0.13 µm node technology.

In the positive ESD zapping, VDD pad voltage is increased. The gate nodes act as a high-pass filter because of drain-to-gate capacitance and the external N-well resistance, and thus will be coupled. After the gate is coupled, the substrate current of the NMOS fingers 32 increases. FIG. 5 shows the normalized DC substrate current in 0.13 µm node technology. In FIG. 5, gate voltage is provided along the horizontal axis, and the normalized substrate current is provided along the vertical axis (Lg=0.24 µm, VDS=2 volts). Since the NMOS P-well 30 is separated by the N-well ring 36, the substrate current flows into the high-resistance P-substrate 34. Furthermore, because the N-well ring 36 is connected to VDD, it suppresses (as identified by line 58 and arcs 60 in FIG. 6) the substrate current flowing to the VSS P-taps (i.e., the outer P-well 40) due to extension of P-substrate depletion, i.e., increasing the effective substrate resistance 42. Thus, the NMOS P-well voltage is built-up, and triggers the parasitic bipolar transistors 62 (see FIG. 3) at low voltage.

Since the gate-coupled effect strongly depends on drain-to-gate capacitance and external N-well resistance, the value of the N-well resistor 50 must be well optimized. Preferably, the value of the resistor 50 is provided at between 15 kilohms (kΩ)-20 kΩ for 300 µm-500 µm NMOS fingers, and lowers the trigger voltage of the NMOS in a positive ESD stress condition.

In the negative ESD zapping, since the N-well 36 is deeper than STI (Shallow-Trench Isolation) 41, the ESD current can flow from P-taps 46 (i.e., VSS) to VDD pad using the P-Well/N-Well junction diode (identified with reference numeral 56 in FIG. 4). Therefore, the N-well ring 36 also provides a negative ESD path to avoid the ESD current flowing through the high-resistance P-substrate region (also see FIG. 6).

By introducing both gate-couple and high-resistance substrate effects, the NMOS fingers 32 have very low trigger voltages. To minimize the layout area, the gate-couple effect is achieved by using a simple N-well resistor 50 with high resistance. The N-well ring 36 is configured to separate the inner P-Well 30 and the outer P-Well 40, where the inner P-well 30 is the P-well underneath the NMOS fingers 32 and the outer P-well 40 is the P-well connected to VSS. Because the N-well ring 36 is connected to VDD pad, the N-well ring 36 suppresses the injected current flowing into the outer P-well 40 by increasing the depletion depth in the P-substrate region (see FIG. 6). The N-well ring 36 also provides a low-impedance ESD path in the negative ESD zapping from the outer P-well 40 to this N-well ring 36.

I/O ESD Protection Circuit

Figure 6:
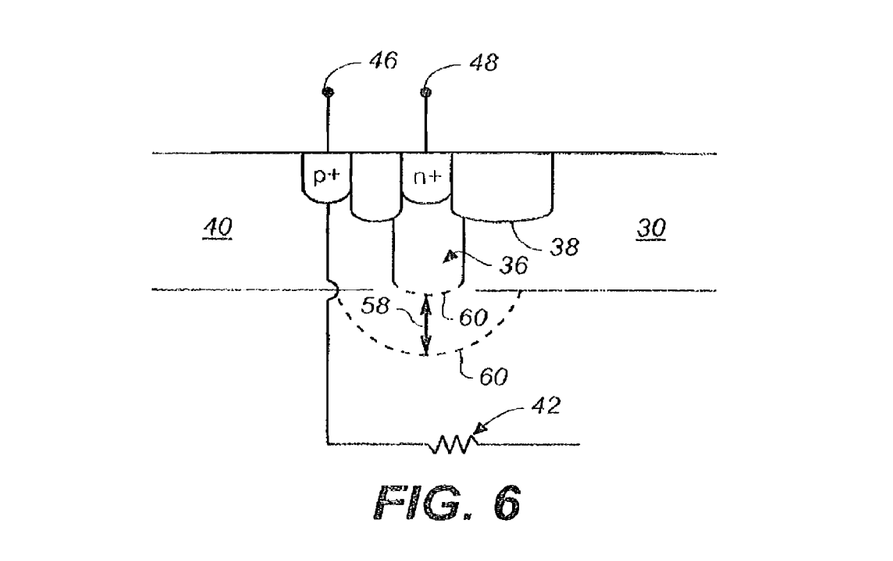
FIG. 6 shows a biased N-well ring to separate P-well regions, which suppresses the substrate current flowing into the VSS P-taps.
Figure 7:
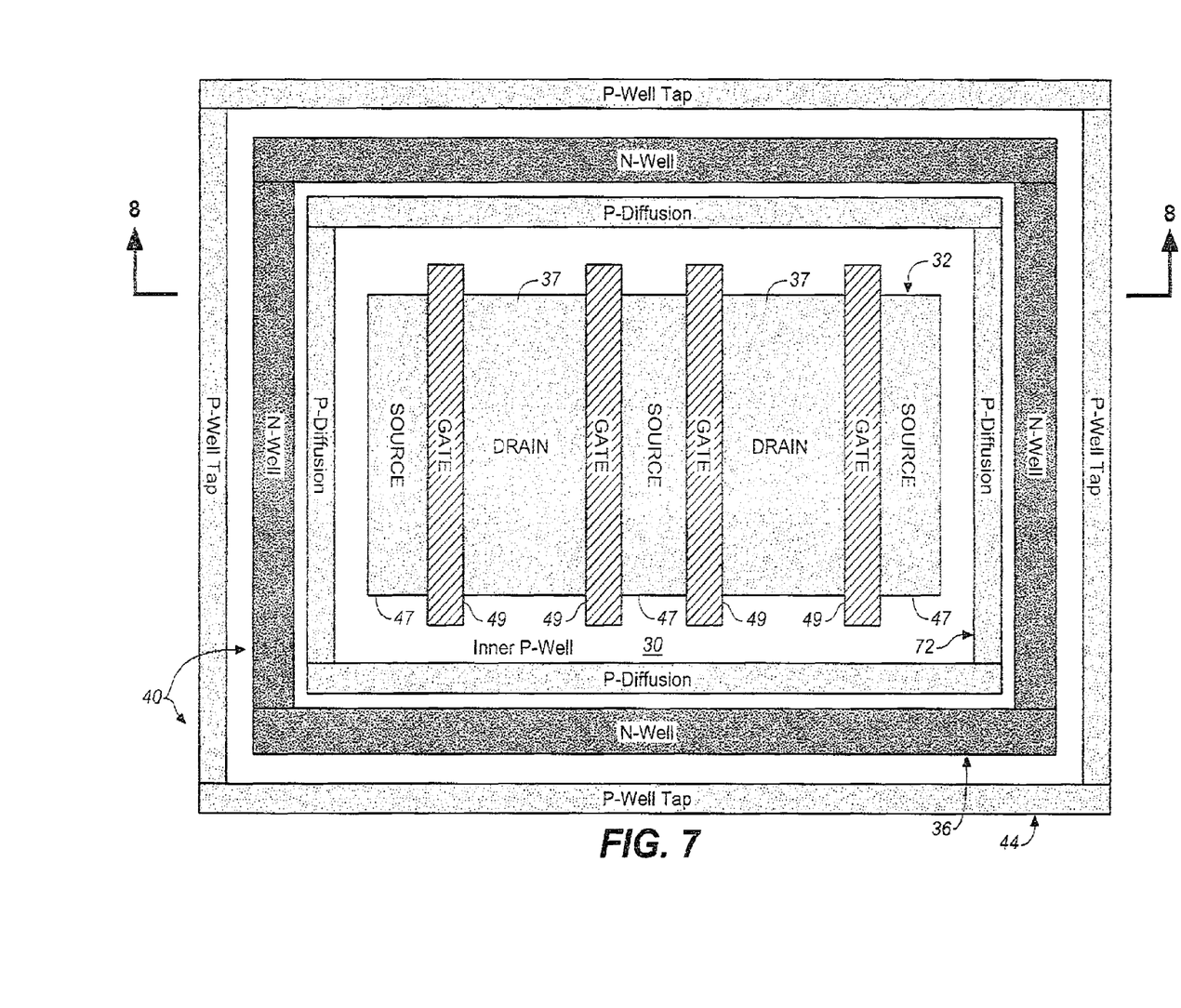
FIGS. 7-10 are similar to FIGS. 2, 3, 4 and 6, but relate to an NMOSFET design layout for I/O ESD protection which is in accordance with another embodiment of the present invention.
Figure 8:
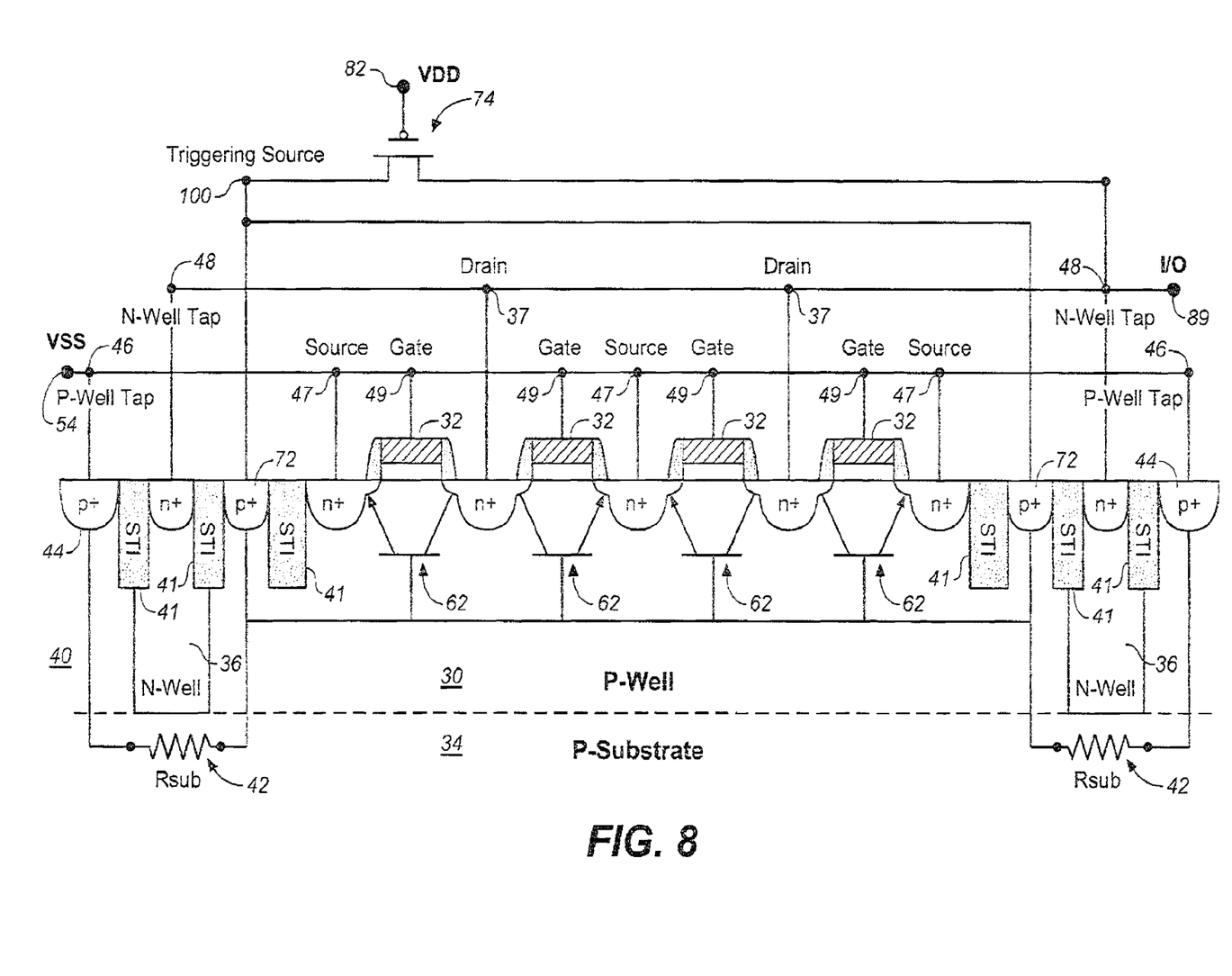
Figure 9:
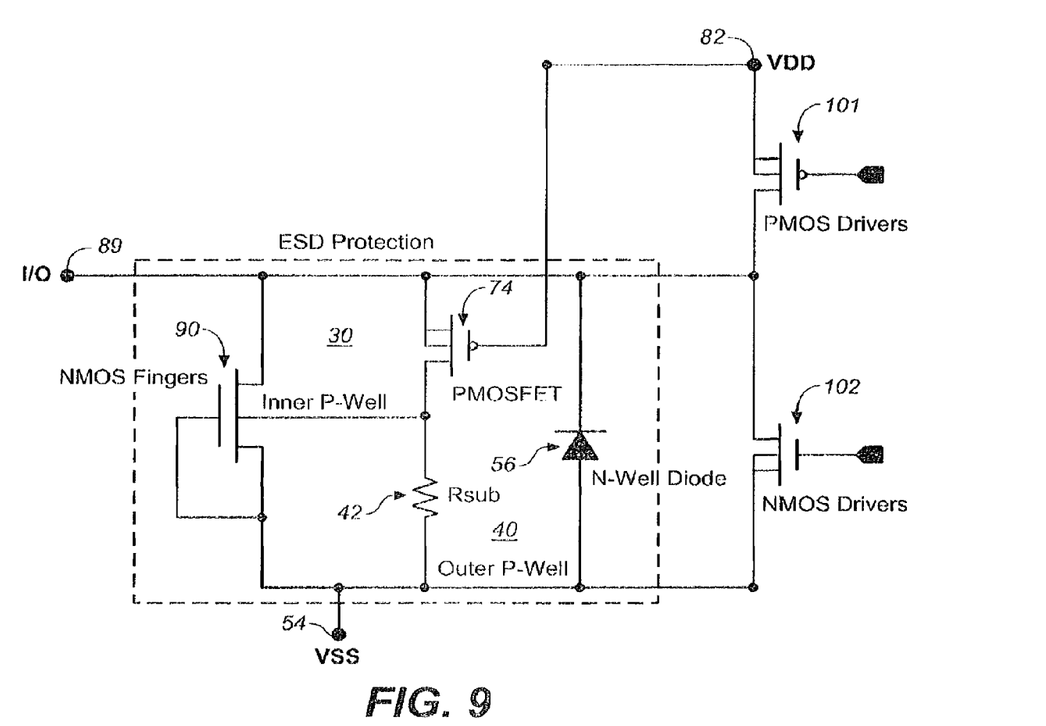

FIGS. 7-10 are similar to FIGS. 2, 3, 4 and 6, respectively, so like reference numerals are used to represent like parts and a detailed description is omitted. However, the differences between the Figures will become apparent from the following description. FIGS. 7 and 8 provide a top-view and a cross-sectional view, respectively, of an NMOSFET design layout which is in accordance with another embodiment of the present invention. In FIGS. 7 and 8, a P-well 30 is underneath grounded-gate NMOS fingers 32 and is surrounded by one P+ diffusion ring 72 which is not hard wired to VSS but is connected to one small-size PMOSFET 74 as the trigger node. An N-well ring 36 surrounds this triggering P+-diffusion ring 72 so that the inner P-well 30 underneath the ggNMOSFET's is separated from the outer P-well 40. The inner P-well 30 and outer P-well 40 are connected by P-substrate resistance 42 which is much higher than the resistance of the P-wells. Finally, a P+-diffusion ring 44 surrounds the N-well 36 and ties to VSS, i.e., P-taps. For small-size PMOSFET's, preferably a long channel length is used (i.e., greater than or equal to 0.5 µm), and its drain and N-well is tied to I/O pads 89, its source is connected to the triggering P+-diffusion, and its gate is connected to VDDIO. A schematic circuit diagram of one of the NMOS fingers is shown in FIG. 9.

In the positive ESD zapping, I/O pad voltage is increased. The gate voltage of PMOSFET's is either the same as VSSIO for the fail-safe case, or lower than I/O pad voltage at least one P/N diode voltage drop for the PMOS driver which N-well is connected to VDDIO. Thus, the PMOSFET is turned on and injects current into the triggering P+-diffusion node. When the injected current is very small, it will just flow to P-taps (i.e., VSSIO) through the P-substrate region underneath the N-well, and thus builds up voltage at the triggering P+-diffusion node. Because of high substrate resistance, the voltage drop at this node increases very easily. When the injected current becomes sufficiently high so that the voltage drop between the triggering P+-diffusion node and VSSIO is higher than the turn-on voltage of the forward junction diode (~0.7V), the injected current begins to flow into the sources of ggNMOSFET's as base current of the bipolar transistors 62. Hence, the ggNMOSFET's are triggered. Besides the injected current, the drains of ggNMOSFET's contribute a small amount of hole current due to weak impact ionization.

Figure 10:
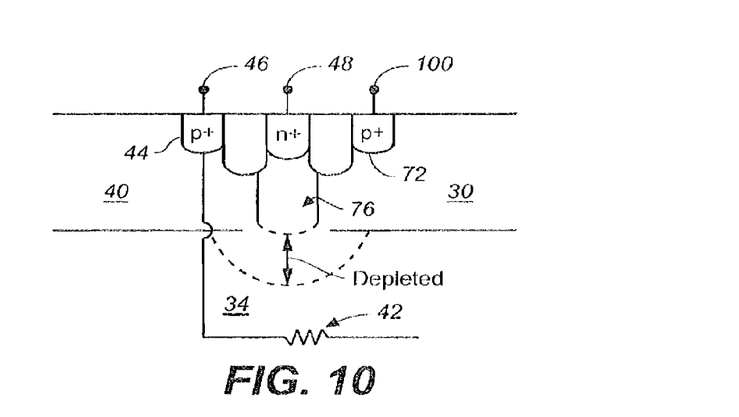

For the N-Well ring, because it is connected to I/O pad, the depletion region in the P-substrate will extend deeper when the I/O pad voltage increases. As shown in FIG. 10, the extended depletion region results in the injected current flowing deeper in the P-substrate region 34, and thus increases the effective substrate resistance. Therefore, in the positive ESD zapping, the N-Well ring plays a role in suppressing the injected current flowing into P-taps (i.e., VSSIO), and thus enhances the current flowing to the sources of ggNMOSFET's (see FIG. 10, noting that node 100 is identified in both FIGS. 8 and 10).

In the negative ESD zapping, since the N-well 36 is deeper than STI (Shallow-Trench Isolation) 41, the ESD current can flow from P-taps (i.e., VSSIO) to I/O pad using the P-Well/N-Well junction diode. Therefore, the N-Well ring 36 also provides a negative ESD path to avoid the ESD current flowing through the high-resistance P-substrate region 34.

A small-size and long channel-length PMOSFET is designed to inject the triggering current. Thus, the ggNMOSFET's (ESD device) (see reference numeral 90 in FIG. 9) are triggered mainly due to the injected current, not the avalanche breakdown mechanism. The size and channel length of PMOSFET is suggested to be around 20 µm and 0.5 µm, respectively. The N-well ring 36 is configured to separate the inner P-well 30 and the outer P-well 40, where the inner P-well 30 is the P-well underneath the ggNMOSFET's and the outer P-well 40 is the P-Well connected to VSSIO. Because the N-well ring 36 is connected to I/O pad 89, the N-well ring 36 suppresses the injected current flowing into the outer P-well 40 by increasing the depletion depth in the P-substrate region 34 (see FIG. 10).

The N-well ring 36 also provides a low-impedance ESD path in the negative ESD zapping from the outer P-well 40 to this N-well ring 36. The triggering P+-diffusion ring sinks the injection current from the PMOSFET. Preferably, the ring is as narrow as possible.

The schematic circuit including PMOS and NMOS drivers 101, 102 is shown in FIG. 9.

In the positive ESD zapping, I/O pad voltage is increased. The gate voltage of PMOSFET's is lower than I/O pad voltage at least one P/N diode voltage drop for the PMOS drivers which N-well is connected to VDD. Thus, the PMOSFET 74 is turned on and injects current into the triggering P-diffusion node within the inner P-well 30. As the injected current is very small, it will just flow into P-well taps 46 within the outer P-well 40 through the P-substrate region 34 underneath the N-well 36, and thus builds up voltage at the triggering P-diffusion node. Because of high substrate resistance 42, the voltage drop at this node will be built-up very easily. As the injected current becomes sufficiently high so that the voltage drop between the triggering P-diffusion node and VSS is higher than turn-on voltage of forward junction diode (~0.7V), the injected current begins flowing into the sources of NMOS fingers as the base current of bipolar transistors. Hence, the NMOS fingers are triggered. Therefore, the PMOSFET as a triggering source as shown in FIGS. 8 and 9 improves the positive ESD stress in this inventive design.

Gate-Coupled Effect for Power ESD Protection

Figure 11:
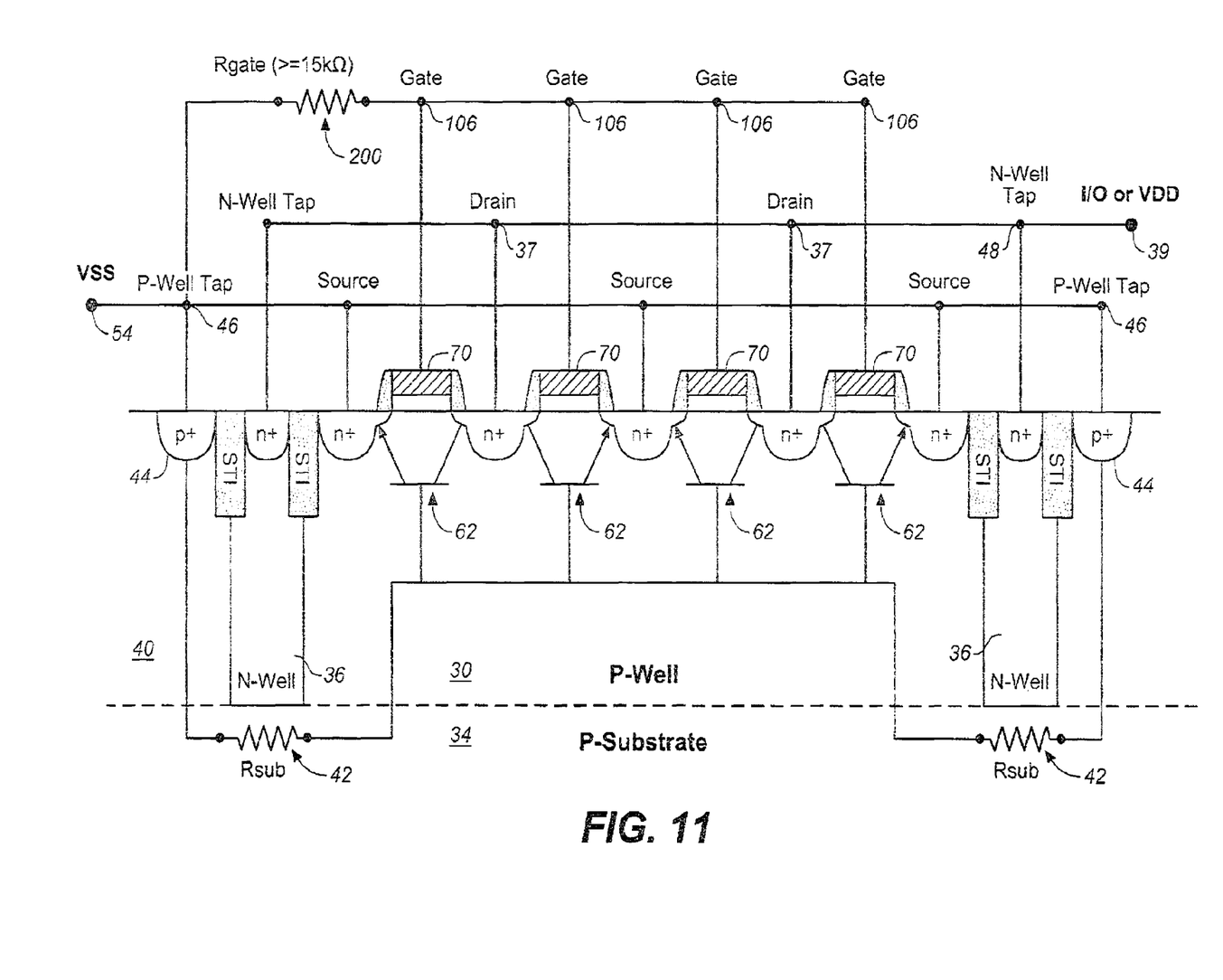
FIG. 11 provides a side, cross-sectional view of another embodiment of the present invention.

In the power ESD protection, the substrate-biased enhancement can be further improved by introducing the gate-coupled effect. A well-known gate-coupled NMOS fingers were designed to lower the triggering voltage by using an external capacitor and an external resistor [A. Amerasekera & C. Duvvury, ESD in Silicon Integrated Circuits, Chapter 4, pp. 55-103]. This gate-coupled device usually needs large layout area, and thus is not feasible. To minimize the layout area, a high-value N-well resistor 200 (preferably having a resistance greater than or equal to 15,000 Ohms) is designed between VSS 54 and gates 106 of NMOS fingers 70 in this inventive design. FIG. 11 shows the cross-sectional diagram for this approach. Since the gate-coupled effect in this inventive design strongly depends on drain-to-gate capacitance of NMOS fingers and the external N-well resistance, the value of the N-well resistor must be well optimized. In deep-submicron CMOS technology, it has been proved that 15 kΩ-20 kΩ typically are the optimized values for 300 μ-500 μm NMOS fingers.

It should be noted that the purpose of the high-value N-well resistor 200 is not to protect gate oxide, but to induce the gate voltage due to gate-coupled effect.

In the positive ESD zapping, VDD pad voltage is increased. The gate nodes of NMOS fingers act as a high-pass filter because of drain-to-gate capacitance and the external N-well resistance, and thus will be coupled up. After the gate is coupled, the substrate current of NMOS fingers increases. FIG. 6 shows the normalized DC substrate current in 0.13 μm technology node. Since the inner P-well is separated by the N-well ring, the substrate current will flow into the high resistance P-substrate. Furthermore, because the N-well ring is connected to VDD, it will suppress the substrate current flowing to the P-well taps within the outer P-well due to extension of P-substrate depletion, i.e., increasing the effective substrate resistance. Thus the inner p-well voltage will be built up, and then trigger the parasitic bipolar transistors at lower voltage.

Therefore, the external high-value N-well resistor (≥15 kΩ) plays an important role in the gate-coupled effect. With this gate-coupled effect, the substrate-biased enhancement of NMOS fingers can be improved in the power ESD protection.

Usually the N-well sheet resistance is very high (~1.5 kΩ/square in the 130 nm technology), the layout area for the gate-coupled effect can be easily minimized.

The invention has been studied and proved in Gflx (130 nm) and G90 (90 nm) technologies. Therefore, this substrate-biased enhancement design has been implemented in G90 I/O and Power ESD protection for LSI G90 products, and may be implemented in more advanced technologies.

While embodiments of the present invention are shown and described, it is envisioned that those skilled in the art may devise various modifications of the present invention without departing from the spirit and scope of the appended claims.

What is claimed is:

1. An electrostatic discharge (ESD) protection circuit for protecting an integrated circuit (IC) pin against positive and negative ESD events, the ESD protection circuit comprising:
a first P-type well formed on a P-conductivity type substrate;
at least one MOS transistor comprising at least one NMOS finger formed on a surface of the substrate within the first P-type well, the at least one NMOS finger including a source connected with VSS, a drain connected with the IC pin, and a gate coupled with VSS;
a second P-type well formed on the substrate, the second P-type well surrounding the first P-type well and being concentric therewith, the second P-type well being connected directly with VSS, the first P-type well being connected to the second P-type well through the substrate;
an N-type well formed on the substrate, the N-type well disposed between the first and second P-type wells and being concentric with the first and second P-type wells, the N-type well being connected with the drain of the at least one NMOS finger;
wherein the second P-type well and the N-type well, together, form a P/N junction diode operative to provide an ESD current path during the negative ESD event.

2. The ESD protection circuit of claim 1, further comprising a resistor connected between the gate of the at least one NMOS finger and VSS.

3. The ESD protection circuit of claim 2, wherein the resistor connected between the gate of the at least one NMOS finger and VSS comprises an N-type well resistor.

4. The ESD protection circuit of claim 2, wherein a resistance of the resistor is greater than about 15 kilohms.

5. The ESD protection circuit of claim 1, wherein the first P-type well has a first resistance associated therewith and the second P-type well has a second resistance associated therewith, a resistance of the substrate connecting the first and second P-type wells being substantially greater than the first resistance or second resistance.

6. The ESD protection circuit of claim 1, wherein the at least one MOS transistor comprises a plurality of NMOS fingers, each of at least a subset of the plurality of NMOS fingers being disposed laterally adjacent to one another and including a source connected with VSS, a drain connected with the IC pin, and a gate coupled with VSS.

7. The ESD protection circuit of claim 1, wherein the IC pin to be protected against positive and negative ESD events comprises one of a power pin and an input/output (I/O) pin.

8. The ESD protection circuit of claim 1, further comprising:
a first shallow trench isolation (STI) formed on the surface of the substrate between the first P-type well and the N-type well; and
a second STI formed on the surface of the substrate between the N-type well and the second P-type well.

9. The ESD protection circuit of claim 8, wherein a depth of the N-type well in the substrate is greater than a depth of each of the first and second STIs.

10. The ESD protection circuit of claim 1, further comprising:
at least a first P-type diffusion ring formed on the surface of the substrate between the first P-type well and the N-type well, the first P-type diffusion ring being concentric with the first P-type well; and
a PMOSFET having a source connected with the P-type diffusion ring, a drain connected with the IC pin, and a gate connected with VDD.

11. The ESD protection circuit of claim 10, wherein the PMOSFET is turned on during the positive ESD event and is operative to inject current from the IC pin into the first P-type well through the first P-type diffusion ring.

12. The ESD protection circuit of claim 10, wherein first P-type diffusion ring is connected with VSS through the substrate.

13. The ESD protection circuit of claim 10, wherein the first P-type diffusion ring is formed within the first P-type well and is operative as a trigger node of the at least one NMOS finger, whereby a trigger voltage of the at least one NMOS finger is lowered.

14. The ESD protection circuit of claim 10, further comprising a second P-type diffusion ring formed on the surface of the substrate between the N-type well and the second P-type well, the second P-type diffusion ring being concentric with the first P-type well and connected directly with VSS, the first P-type diffusion ring being connected to the second P-type diffusion ring through the substrate.

15. The ESD protection circuit of claim 14, wherein the second P-type diffusion ring is formed within the second P-type well surrounding the N-type well, the second P-type diffusion ring providing an electrical connection between the second P-type well and VSS.

16. The ESD protection circuit of claim 14, further comprising:
   a first shallow trench isolation (STI) formed on the surface of the substrate between the first P-type well and the first P-type diffusion ring;
   a second STI formed on the surface of the substrate between the first P-type diffusion ring and the N-type well; and
   a third STI formed on the surface of the substrate between the N-type well and the second P-type diffusion ring.

17. The ESD protection circuit of claim 16, wherein a depth of the N-type well in the substrate is greater than a depth of each of the first, second and third STIs.

18. The ESD protection circuit of claim 1, wherein the N-type well is connected directed with the IC pin and is operative to suppress a substrate current flowing to VSS through the second P-type well to thereby lower a trigger voltage of the at least one MOS transistor during the positive ESD event.

19. An integrated circuit (IC) comprising at least one electrostatic discharge (ESD) protection circuit for protecting a pin of the IC against positive and negative ESD events, the at least one ESD protection circuit comprising:
   a first P-type well formed on a P-conductivity type substrate;
   at least one MOS transistor comprising at least one NMOS finger formed on a surface of the substrate within the first P-type well, the at least one NMOS finger including a source connected with VSS, a drain connected with the IC pin, and a gate coupled with VSS;
   a second P-type well formed on the substrate, the second P-type well surrounding the first P-type well and being concentric therewith, the second P-type well being connected directly with VSS, the first P-type well being connected to the second P-type well through the substrate;
   an N-type well formed on the substrate, the N-type well disposed between the first and second P-type wells and being concentric with the first and second P-type wells, the N-type well being connected with the drain of the at least one NMOS finger;
   wherein the second P-type well and the N-type well, together, form a P/N junction diode operative to provide an ESD current path during the negative ESD event.

20. An electrostatic discharge (ESD) protection circuit for protecting an integrated circuit (IC) pin against positive and negative ESD events, the ESD protection circuit comprising:
   a first well of a first conductivity type formed on a semiconductor substrate;
   at least one transistor comprising at least one MOS finger formed on a surface of the substrate within the first well, the at least one MOS finger including a source connected with a first voltage supply, a drain connected with the IC pin, and a gate coupled with the first voltage supply;
   a second well of the first conductivity type formed on the substrate, the second well surrounding the first well and being concentric therewith, the second well being connected directly with the first voltage supply, the first well being connected to the second well through the substrate;
   a third well of a second conductivity type formed on the substrate, the second conductivity type being opposite in polarity to the first conductivity type, the third well disposed between the first and second wells and being concentric with the first and second wells, the third well being connected with the drain of the at least one MOS finger;
   wherein the second well and the third well, together, form a P/N junction diode operative to provide an ESD current path during the negative ESD event.

* * * * *